United States Patent
Shalvi

(10) Patent No.: US 7,773,413 B2
(45) Date of Patent: Aug. 10, 2010

(54) RELIABLE DATA STORAGE IN ANALOG MEMORY CELLS IN THE PRESENCE OF TEMPERATURE VARIATIONS

(75) Inventor: Ofir Shalvi, Ra'Anana (IL)

(73) Assignee: Anobit Technologies Ltd., Herzliya Pituach (IL)

( * ) Notice: Subject to any disclaimer, the term of this patent is extended or adjusted under 35 U.S.C. 154(b) by 25 days.

(21) Appl. No.: 12/245,749

(22) Filed: Oct. 5, 2008

(65) Prior Publication Data

US 2009/0091979 A1   Apr. 9, 2009

Related U.S. Application Data

(60) Provisional application No. 60/978,146, filed on Oct. 8, 2007.

(51) Int. Cl.
 *G11C 16/04* (2006.01)
(52) U.S. Cl. .................................. 365/185.02; 365/211
(58) Field of Classification Search ............ 365/185.02, 365/211, 185.03
See application file for complete search history.

(56) References Cited

U.S. PATENT DOCUMENTS

| | | | |
|---|---|---|---|
| 4,556,961 A | 12/1985 | Iwahashi et al. |
| 4,558,431 A | 12/1985 | Satoh |
| 4,661,929 A | 4/1987 | Aoki et al. |
| 4,768,171 A | 8/1988 | Tada |
| 4,811,285 A | 3/1989 | Walker et al. |
| 4,899,342 A | 2/1990 | Potter et al. |
| 4,910,706 A | 3/1990 | Hyatt |
| 4,993,029 A | 2/1991 | Galbraith et al. |
| 5,056,089 A | 10/1991 | Mehrotta et al. |
| 5,077,722 A | 12/1991 | Geist et al. |
| 5,172,338 A | 12/1992 | Mehrotra et al. |
| 5,191,584 A | 3/1993 | Anderson |
| 5,200,959 A | 4/1993 | Gross et al. |

(Continued)

FOREIGN PATENT DOCUMENTS

EP    0783754 B1    7/1997

(Continued)

OTHER PUBLICATIONS

U.S. Appl. No. 11/949,135 Official Action dated Oct. 2, 2009.

(Continued)

*Primary Examiner*—Vu A Le
(74) *Attorney, Agent, or Firm*—D. Kligler J.P. Services Ltd.

(57) ABSTRACT

A method for data storage includes programming a first group of analog memory cells at a first time at a known first temperature, so as to cause the analog memory cells in the first group to assume respective first analog storage values. Respective second analog storage values are read from the analog memory cells in the first group at a second time at which the analog memory cells are at a second temperature. A shift is estimated between the first analog storage values and the second analog storage values, and a memory access parameter is adjusted responsively to the estimated shift. A second group of the analog memory cells is accessed at the second temperature using the adjusted memory access parameter.

25 Claims, 3 Drawing Sheets

U.S. PATENT DOCUMENTS

| | | | |
|---|---|---|---|
| 5,237,535 | A | 8/1993 | Mielke et al. |
| 5,272,669 | A | 12/1993 | Samachisa et al. |
| 5,276,649 | A | 1/1994 | Hoshita et al. |
| 5,388,064 | A | 2/1995 | Khan |
| 5,416,782 | A | 5/1995 | Wells et al. |
| 5,473,753 | A | 12/1995 | Wells et al. |
| 5,479,170 | A | 12/1995 | Cauwenberghs et al. |
| 5,508,958 | A | 4/1996 | Fazio et al. |
| 5,519,831 | A | 5/1996 | Holzhammer |
| 5,541,886 | A | 7/1996 | Hasbun |
| 5,600,677 | A | 2/1997 | Citta et al. |
| 5,657,332 | A | 8/1997 | Auclair et al. |
| 5,675,540 | A | 10/1997 | Roohparvar |
| 5,696,717 | A | 12/1997 | Koh |
| 5,726,649 | A | 3/1998 | Tamaru et al. |
| 5,742,752 | A | 4/1998 | De Koning |
| 5,751,637 | A | 5/1998 | Chen et al. |
| 5,761,402 | A | 6/1998 | Kaneda et al. |
| 5,801,985 | A | 9/1998 | Roohparvar et al. |
| 5,838,832 | A | 11/1998 | Barnsley |
| 5,860,106 | A | 1/1999 | Domen et al. |
| 5,867,429 | A | 2/1999 | Chen et al. |
| 5,877,986 | A | 3/1999 | Harari et al. |
| 5,901,089 | A | 5/1999 | Korsh et al. |
| 5,909,449 | A | 6/1999 | So et al. |
| 5,912,906 | A | 6/1999 | Wu et al. |
| 5,930,167 | A | 7/1999 | Lee et al. |
| 5,942,004 | A | 8/1999 | Cappelletti |
| 5,991,517 | A | 11/1999 | Harari et al. |
| 6,009,014 | A | 12/1999 | Hollmer et al. |
| 6,034,891 | A | 3/2000 | Norman |
| 6,040,993 | A | 3/2000 | Chen et al. |
| 6,041,430 | A | 3/2000 | Yamauchi |
| 6,073,204 | A | 6/2000 | Lakhani et al. |
| 6,101,614 | A | 8/2000 | Gonzales et al. |
| 6,128,237 | A | 10/2000 | Shirley et al. |
| 6,134,140 | A | 10/2000 | Tanaka et al. |
| 6,134,143 | A | 10/2000 | Norman |
| 6,134,631 | A | 10/2000 | Jennings |
| 6,141,261 | A | 10/2000 | Patti |
| 6,166,962 | A | 12/2000 | Chen et al. |
| 6,185,134 | B1 | 2/2001 | Tanaka et al. |
| 6,209,113 | B1 | 3/2001 | Roohparvar |
| 6,212,654 | B1 | 4/2001 | Lou et al. |
| 6,219,276 | B1 | 4/2001 | Parker |
| 6,219,447 | B1 | 4/2001 | Lee et al. |
| 6,222,762 | B1 | 4/2001 | Guterman et al. |
| 6,230,233 | B1 | 5/2001 | Lofgren et al. |
| 6,275,419 | B1 | 8/2001 | Guterman et al. |
| 6,279,069 | B1 | 8/2001 | Robinson et al. |
| 6,288,944 | B1 | 9/2001 | Kawamura |
| 6,292,394 | B1 | 9/2001 | Cohen et al. |
| 6,301,151 | B1 | 10/2001 | Engh et al. |
| 6,304,486 | B1 | 10/2001 | Yano |
| 6,307,776 | B1 | 10/2001 | So et al. |
| 6,317,363 | B1 | 11/2001 | Guterman et al. |
| 6,317,364 | B1 | 11/2001 | Guterman et al. |
| 6,363,008 | B1 | 3/2002 | Wong |
| 6,363,454 | B1 | 3/2002 | Lakhani et al. |
| 6,396,742 | B1 | 5/2002 | Korsh et al. |
| 6,397,364 | B1 | 5/2002 | Barkan |
| 6,405,323 | B1 | 6/2002 | Lin et al. |
| 6,442,585 | B1 | 8/2002 | Dean et al. |
| 6,456,528 | B1 | 9/2002 | Chen |
| 6,466,476 | B1 | 10/2002 | Wong et al. |
| 6,467,062 | B1 | 10/2002 | Barkan |
| 6,469,931 | B1 | 10/2002 | Ban et al. |
| 6,522,580 | B2 | 2/2003 | Chen et al. |
| 6,525,952 | B2 | 2/2003 | Araki et al. |
| 6,532,556 | B1 | 3/2003 | Wong et al. |
| 6,538,922 | B1 | 3/2003 | Khalid et al. |
| 6,558,967 | B1 | 5/2003 | Wong |
| 6,560,152 | B1 | 5/2003 | Cernea |
| 6,577,539 | B2 | 6/2003 | Iwahashi |
| 6,584,012 | B2 | 6/2003 | Banks |
| 6,615,307 | B1 | 9/2003 | Roohparvar |
| 6,621,739 | B2 | 9/2003 | Gonzalez et al. |
| 6,643,169 | B2 | 11/2003 | Rudelic et al. |
| 6,678,192 | B2 | 1/2004 | Gongwer et al. |
| 6,687,155 | B2 | 2/2004 | Nagasue |
| 6,707,748 | B2 | 3/2004 | Lin et al. |
| 6,708,257 | B2 | 3/2004 | Bao |
| 6,717,847 | B2 | 4/2004 | Chen |
| 6,731,557 | B2 | 5/2004 | Beretta |
| 6,738,293 | B1 | 5/2004 | Iwahashi |
| 6,751,766 | B2 | 6/2004 | Guterman et al. |
| 6,757,193 | B2 | 6/2004 | Chen et al. |
| 6,774,808 | B1 | 8/2004 | Hibbs et al. |
| 6,781,877 | B2 | 8/2004 | Cernea et al. |
| 6,807,095 | B2 | 10/2004 | Chen et al. |
| 6,829,167 | B2 | 12/2004 | Tu et al. |
| 6,845,052 | B1 | 1/2005 | Ho et al. |
| 6,851,018 | B2 | 2/2005 | Wyatt et al. |
| 6,856,546 | B2 | 2/2005 | Guterman et al. |
| 6,862,218 | B2 | 3/2005 | Guterman et al. |
| 6,870,767 | B2 | 3/2005 | Rudelic et al. |
| 6,894,926 | B2 | 5/2005 | Guterman et al. |
| 6,907,497 | B2 | 6/2005 | Hosono et al. |
| 6,963,505 | B2 | 11/2005 | Cohen |
| 6,972,993 | B2 | 12/2005 | Conley et al. |
| 6,988,175 | B2 | 1/2006 | Lasser |
| 6,992,932 | B2 | 1/2006 | Cohen |
| 7,002,843 | B2 | 2/2006 | Guterman et al. |
| 7,012,835 | B2 | 3/2006 | Gonzalez et al. |
| 7,020,017 | B2 | 3/2006 | Chen et al. |
| 7,023,735 | B2 | 4/2006 | Ban et al. |
| 7,031,210 | B2 | 4/2006 | Park et al. |
| 7,031,214 | B2 | 4/2006 | Tran |
| 7,031,216 | B2 | 4/2006 | You |
| 7,054,193 | B1 | 5/2006 | Wong |
| 7,057,958 | B2 | 6/2006 | So et al. |
| 7,065,147 | B2 | 6/2006 | Ophir et al. |
| 7,068,539 | B2 | 6/2006 | Guterman et al. |
| 7,079,555 | B2 | 7/2006 | Baydar et al. |
| 7,088,615 | B2 | 8/2006 | Guterman et al. |
| 7,099,194 | B2 | 8/2006 | Tu et al. |
| 7,102,924 | B2 | 9/2006 | Chen et al. |
| 7,113,432 | B2 | 9/2006 | Mokhlesi |
| 7,130,210 | B2 | 10/2006 | Bathul et al. |
| 7,139,192 | B1 | 11/2006 | Wong |
| 7,139,198 | B2 | 11/2006 | Guterman et al. |
| 7,170,802 | B2 | 1/2007 | Cernea et al. |
| 7,173,859 | B2 | 2/2007 | Hemink |
| 7,177,184 | B2 | 2/2007 | Chen |
| 7,177,195 | B2 | 2/2007 | Gonzales et al. |
| 7,177,199 | B2 | 2/2007 | Chen et al. |
| 7,177,200 | B2 | 2/2007 | Ronen et al. |
| 7,187,195 | B2 | 3/2007 | Kim |
| 7,187,592 | B2 | 3/2007 | Guterman et al. |
| 7,193,898 | B2 | 3/2007 | Cernea |
| 7,193,921 | B2 | 3/2007 | Choi et al. |
| 7,196,928 | B2 | 3/2007 | Chen |
| 7,197,594 | B2 | 3/2007 | Raz et al. |
| 7,200,062 | B2 | 4/2007 | Kinsely et al. |
| 7,221,592 | B2 | 5/2007 | Nazarian |
| 7,224,613 | B2 | 5/2007 | Chen et al. |
| 7,231,474 | B1 | 6/2007 | Helms et al. |
| 7,243,275 | B2 | 7/2007 | Gongwer et al. |
| 7,254,690 | B2 | 8/2007 | Rao |
| 7,257,027 | B2 | 8/2007 | Park |
| 7,259,987 | B2 | 8/2007 | Chen et al. |
| 7,266,026 | B2 | 9/2007 | Gongwer et al. |
| 7,274,611 | B2 | 9/2007 | Roohparvar |
| 7,277,355 | B2 | 10/2007 | Tanzawa |

| | | | | | |
|---|---|---|---|---|---|
| 7,280,398 B1 | 10/2007 | Lee et al. | 2006/0285392 A1 | 12/2006 | Incarnati et al. |
| 7,289,344 B2 | 10/2007 | Chen | 2006/0285396 A1 | 12/2006 | Ha |
| 7,301,807 B2 | 11/2007 | Khalid et al. | 2007/0006013 A1 | 1/2007 | Moshayedi et al. |
| 7,308,525 B2 | 12/2007 | Lasser et al. | 2007/0019481 A1 | 1/2007 | Park |
| 7,310,255 B2 | 12/2007 | Chan | 2007/0033581 A1 | 2/2007 | Tomlin et al. |
| 7,310,272 B1 | 12/2007 | Mokhlesi et al. | 2007/0047314 A1 | 3/2007 | Goda et al. |
| 7,321,509 B2 | 1/2008 | Chen et al. | 2007/0047326 A1 | 3/2007 | Nguyen et al. |
| 7,342,831 B2 | 3/2008 | Mokhlesi et al. | 2007/0050536 A1 | 3/2007 | Kolokowsky |
| 7,345,928 B2 | 3/2008 | Li | 2007/0058446 A1 | 3/2007 | Hwang et al. |
| 7,349,263 B2 | 3/2008 | Kim et al. | 2007/0061502 A1 | 3/2007 | Lasser et al. |
| 7,356,755 B2 | 4/2008 | Fackenthal | 2007/0067667 A1 | 3/2007 | Ikeuchi et al. |
| 7,363,420 B2 | 4/2008 | Lin et al. | 2007/0074093 A1 | 3/2007 | Lasser |
| 7,397,697 B2 | 7/2008 | So et al. | 2007/0086239 A1 | 4/2007 | Litsyn et al. |
| 7,408,804 B2 | 8/2008 | Hemink et al. | 2007/0086260 A1 | 4/2007 | Sinclair |
| 7,409,473 B2 | 8/2008 | Conley et al. | 2007/0089034 A1 | 4/2007 | Litsyn et al. |
| 7,420,847 B2 | 9/2008 | Li | 2007/0091677 A1 | 4/2007 | Lasser et al. |
| 7,433,231 B2 | 10/2008 | Aritome | 2007/0091694 A1 | 4/2007 | Lee et al. |
| 7,437,498 B2 | 10/2008 | Ronen | 2007/0103978 A1 | 5/2007 | Conley et al. |
| 7,441,067 B2 | 10/2008 | Gorobetz et al. | 2007/0103986 A1 | 5/2007 | Chen |
| 7,453,737 B2 | 11/2008 | Ha | 2007/0109845 A1 | 5/2007 | Chen |
| 7,468,911 B2 | 12/2008 | Lutze et al. | 2007/0109849 A1 | 5/2007 | Chen |
| 7,471,581 B2 | 12/2008 | Tran et al. | 2007/0118713 A1 | 5/2007 | Guterman et al. |
| 7,508,710 B2 | 3/2009 | Mokhlesi | 2007/0143378 A1 | 6/2007 | Gorobetz |
| 7,539,062 B2 | 5/2009 | Doyle | 2007/0143531 A1 | 6/2007 | Atri |
| 7,570,520 B2 | 8/2009 | Kamei et al. | 2007/0159889 A1 | 7/2007 | Kang et al. |
| 7,593,259 B2 | 9/2009 | Kim et al. | 2007/0159892 A1 | 7/2007 | Kang et al. |
| 7,633,802 B2 | 12/2009 | Mokhlesi | 2007/0159907 A1 | 7/2007 | Kwak |
| 7,660,158 B2 | 2/2010 | Aritome | 2007/0168837 A1 | 7/2007 | Murin |
| 2001/0006479 A1 | 7/2001 | Ikehashi et al. | 2007/0171714 A1 | 7/2007 | Wu et al. |
| 2002/0118574 A1 | 8/2002 | Gongwer et al. | 2007/0183210 A1 | 8/2007 | Choi et al. |
| 2002/0174295 A1 | 11/2002 | Ulrich et al. | 2007/0189073 A1 | 8/2007 | Aritome |
| 2002/0196510 A1 | 12/2002 | Hietala et al. | 2007/0206426 A1 | 9/2007 | Mokhlesi |
| 2003/0002348 A1 | 1/2003 | Chen et al. | 2007/0208904 A1 | 9/2007 | Hsieh et al. |
| 2003/0103400 A1 | 6/2003 | Van Tran | 2007/0226599 A1 | 9/2007 | Motwani |
| 2003/0161183 A1 | 8/2003 | Van Tran | 2007/0236990 A1 | 10/2007 | Aritome |
| 2003/0189856 A1 | 10/2003 | Cho et al. | 2007/0253249 A1 | 11/2007 | Kang et al. |
| 2004/0057265 A1 | 3/2004 | Mirabel et al. | 2007/0256620 A1 | 11/2007 | Viggiano et al. |
| 2004/0057285 A1 | 3/2004 | Cernea et al. | 2007/0266232 A1 | 11/2007 | Rodgers et al. |
| 2004/0083333 A1 | 4/2004 | Chang et al. | 2007/0271424 A1 | 11/2007 | Lee et al. |
| 2004/0083334 A1 | 4/2004 | Chang et al. | 2007/0280000 A1 | 12/2007 | Fujiu et al. |
| 2004/0105311 A1 | 6/2004 | Cernea et al. | 2008/0010395 A1 | 1/2008 | Mylly et al. |
| 2004/0114437 A1 | 6/2004 | Li | 2008/0025121 A1 | 1/2008 | Tanzawa |
| 2004/0160842 A1 | 8/2004 | Fukiage | 2008/0043535 A1 | 2/2008 | Roohparvar |
| 2005/0007802 A1 | 1/2005 | Gerpheide | 2008/0049504 A1 | 2/2008 | Kasahara et al. |
| 2005/0013165 A1 | 1/2005 | Ban | 2008/0049506 A1 | 2/2008 | Guterman |
| 2005/0024941 A1 | 2/2005 | Lasser et al. | 2008/0055993 A1 | 3/2008 | Lee |
| 2005/0024978 A1 | 2/2005 | Ronen | 2008/0080243 A1 | 4/2008 | Edahiro et al. |
| 2005/0086574 A1 | 4/2005 | Fackenthal | 2008/0082730 A1 | 4/2008 | Kim et al. |
| 2005/0121436 A1 | 6/2005 | Kamitani et al. | 2008/0104309 A1 | 5/2008 | Cheon et al. |
| 2005/0162913 A1 | 7/2005 | Chen | 2008/0109590 A1 | 5/2008 | Jung et al. |
| 2005/0169051 A1 | 8/2005 | Khalid et al. | 2008/0115017 A1 | 5/2008 | Jacobson |
| 2005/0189649 A1 | 9/2005 | Maruyama et al. | 2008/0123420 A1 | 5/2008 | Brandman et al. |
| 2005/0213393 A1 | 9/2005 | Lasser | 2008/0126686 A1 | 5/2008 | Sokolov et al. |
| 2005/0224853 A1 | 10/2005 | Ohkawa | 2008/0130341 A1 | 6/2008 | Shalvi et al. |
| 2005/0240745 A1 | 10/2005 | Iyer et al. | 2008/0148115 A1 | 6/2008 | Sokolov et al. |
| 2005/0243626 A1 | 11/2005 | Ronen | 2008/0158958 A1 | 7/2008 | Sokolov et al. |
| 2006/0004952 A1 | 1/2006 | Lasser | 2008/0181001 A1* | 7/2008 | Shalvi .................. 365/185.03 |
| 2006/0028875 A1 | 2/2006 | Avraham et al. | 2008/0198650 A1 | 8/2008 | Shalvi et al. |
| 2006/0028877 A1 | 2/2006 | Meir | 2008/0209116 A1 | 8/2008 | Caulkins |
| 2006/0101193 A1 | 5/2006 | Murin | 2008/0209304 A1 | 8/2008 | Winarski et al. |
| 2006/0107136 A1 | 5/2006 | Gongwer et al. | 2008/0215798 A1 | 9/2008 | Sharon et al. |
| 2006/0129750 A1 | 6/2006 | Lee et al. | 2008/0219050 A1 | 9/2008 | Shalvi et al. |
| 2006/0133141 A1 | 6/2006 | Gorobetz | 2008/0239812 A1 | 10/2008 | Abiko et al. |
| 2006/0156189 A1 | 7/2006 | Tomlin | 2008/0263262 A1 | 10/2008 | Sokolov et al. |
| 2006/0179334 A1 | 8/2006 | Brittain et al. | 2008/0282106 A1 | 11/2008 | Shalvi et al. |
| 2006/0203546 A1 | 9/2006 | Lasser | 2009/0024905 A1 | 1/2009 | Shalvi et al. |
| 2006/0218359 A1 | 9/2006 | Sanders et al. | 2009/0043831 A1 | 2/2009 | Antonopoulos et al. |
| 2006/0221705 A1 | 10/2006 | Hemink et al. | 2009/0043951 A1 | 2/2009 | Shalvi et al. |
| 2006/0239077 A1 | 10/2006 | Park et al. | 2009/0049234 A1 | 2/2009 | Oh et al. |
| 2006/0256620 A1 | 11/2006 | Nguyen et al. | 2009/0089484 A1 | 4/2009 | Chu |
| 2006/0256626 A1 | 11/2006 | Werner et al. | 2009/0091979 A1 | 4/2009 | Shalvi |
| 2006/0256891 A1 | 11/2006 | Yuan et al. | 2009/0094930 A1* | 4/2009 | Schwoerer .................. 52/693 |
| 2006/0271748 A1 | 11/2006 | Jain et al. | 2009/0106485 A1 | 4/2009 | Anholt |

| | | | |
|---|---|---|---|
| 2009/0132755 | A1 | 5/2009 | Radke |
| 2009/0144600 | A1 | 6/2009 | Perlmutter et al. |
| 2009/0150894 | A1 | 6/2009 | Huang et al. |
| 2009/0172257 | A1 | 7/2009 | Prins et al. |
| 2009/0172261 | A1 | 7/2009 | Prins et al. |
| 2009/0204824 | A1 | 8/2009 | Lin et al. |
| 2009/0204872 | A1 | 8/2009 | Yu et al. |
| 2009/0225595 | A1 | 9/2009 | Kim |
| 2009/0300227 | A1 | 12/2009 | Nochimowski et al. |
| 2009/0323412 | A1* | 12/2009 | Mokhlesi et al. ....... 365/185.02 |
| 2009/0327608 | A1 | 12/2009 | Eschmann |
| 2010/0017650 | A1 | 1/2010 | Chin et al. |
| 2010/0061151 | A1 | 3/2010 | Miwa et al. |

FOREIGN PATENT DOCUMENTS

| | | |
|---|---|---|
| EP | 1434236 B1 | 6/2004 |
| EP | 1605509 A1 | 12/2005 |
| WO | 9610256 A1 | 4/1996 |
| WO | 9828745 A1 | 7/1998 |
| WO | 2007046084 A2 | 4/2007 |
| WO | 2007132452 A2 | 11/2007 |
| WO | 2007132453 A2 | 11/2007 |
| WO | 2007132456 A2 | 11/2007 |
| WO | 2007132457 A2 | 11/2007 |
| WO | 2007132458 A2 | 11/2007 |
| WO | 2007146010 A2 | 12/2007 |
| WO | 2008026203 A2 | 3/2008 |
| WO | 2008053472 A2 | 5/2008 |
| WO | 2008053473 A2 | 5/2008 |
| WO | 2008068747 A2 | 6/2008 |
| WO | 2008077284 A1 | 7/2008 |
| WO | 2008083131 A2 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009072100 A2 | 6/2009 |
| WO | 2009072101 A2 | 6/2009 |
| WO | 2009072102 A2 | 6/2009 |
| WO | 2009072103 A2 | 6/2009 |
| WO | 2009072104 A2 | 6/2009 |
| WO | 2009072105 A2 | 6/2009 |
| WO | 2009074978 A2 | 6/2009 |
| WO | 2009074979 A2 | 6/2009 |
| WO | 2009078006 A2 | 6/2009 |
| WO | 2009095902 A2 | 8/2009 |

OTHER PUBLICATIONS

Agrell et al., "Closest Point Search in Lattices", IEEE Transactions on Information Theory, vol. 48, No. 8, pp. 2201-2214, Aug. 2002.

Bez et al., "Introduction to Flash memory", Proceedings of the IEEE, vol. 91, No. 4, pp. 489-502, Apr. 2003.

Blahut, R.E., "Theory and Practice of Error Control Codes," Addison-Wesley, May 1984, section 3.2, pp. 47-48.

Chang, L., "Hybrid Solid State Disks: Combining Heterogeneous NAND Flash in Large SSDs", ASPDAC, Jan. 2008.

Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.

Databahn™, "Flash memory controller IP", Denali Software, Inc., 1994 https://www.denali.com/en/products/databahn_flash.jsp.

Datalight, Inc., "FlashFX Pro 3.1 High Performance Flash Manager for Rapid Development of Reliable Products", Nov. 16, 2006.

Duann, N., Silicon Motion Presentation "SLC & MLC Hybrid", Flash Memory Summit, Santa Clara, USA, Aug. 2008.

Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.

Eitan et al., "Multilevel Flash Cells and their Trade-Offs", Proceedings of the 1996 IEEE International Electron Devices Meeting (IEDM), pp. 169-172, New York, USA 1996.

Engh et al., "A self adaptive programming method with 5 mV accuracy for multi-level storage in Flash", pp. 115-118, Proceedings of the IEEE 2002 Custom Integrated Circuits Conference, May 12-15, 2002.

Goodman et al., "On-Chip ECC for Multi-Level Random Access Memories," Proceedings of the IEEE/CAM Information Theory Workshop, Ithaca, USA, Jun. 25-29, 1989.

Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.

Han et al., "CATA: A Garbage Collection Scheme for Flash Memory File Systems", Ubiquitous Intelligence and Computing, vol. 4159/2006, pp. 103-112, Springer Berlin / Heidelberg, Aug. 25, 2006.

Horstein, "On the Design of Signals for Sequential and Nonsequential Detection Systems with Feedback," IEEE Transactions on Information Theory IT-12:4 (Oct. 1966), pp. 448-455.

Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.

Kawaguchi et al. 1995. A flash-memory based file system. In Proceedings of the USENIX 1995 Technical Conference, New Orleans, Louisiana. 155-164.

Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.

Lee et al., "Effects of Floating Gate Interference on NAND Flash Memory Cell Operation", IEEE Electron Device Letters, vol. 23, No. 5, pp. 264-266, May 2002.

Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.

Mielke et al., "Recovery Effects in the Distributed Cycling of Flash Memories", IEEE 44th Annual International Reliability Physics Symposium, pp. 29-35, San Jose, USA, Mar. 2006.

Onfi, "Open NAND Flash Interface Specification," revision 1.0, Dec. 28, 2006.

Phison Electronics Corporation, "PS8000 Controller Specification (for SD Card)", revision 1.2, Document No. S-07018, Mar. 28, 2007.

Shalvi, et al., "Signal Codes," Proceedings of the 2003 IEEE Information Theory Workshop (ITW'2003), Paris, France, Mar. 31-Apr. 4, 2003.

Shiozaki, A., "Adaptive Type-II Hybrid Broadcast ARQ System", IEEE Transactions on Communications, vol. 44, Issue 4, pp. 420-422, Apr. 1996.

Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.

ST Microelectronics, "Bad Block Management in NAND Flash Memories", Application note AN-1819, Geneva, Switzerland, May 2004.

ST Microelectronics, "Wear Leveling in Single Level Cell NAND Flash Memories," Application note AN-1822 Geneva, Switzerland, Feb. 2007.

Takeuchi et al., "A Double Level $V_{TH}$ Select Gate Array Architecture for Multi-Level NAND Flash Memories", Digest of Technical Papers, 1995 Symposium on VLSI Circuits, pp. 69-70, Jun. 8-10, 1995.

Wu et al., "eNVy: A non-Volatile, Main Memory Storage System", Proceedings of the 6th International Conference on Architectural support for programming languages and operating systems, pp. 86-87, San Jose, USA, 1994.

International Application PCT/IL2007/000575 Patentability report dated Mar. 26, 2009.

International Application PCT/IL2007/000575 Search Report dated May 30, 2008.

International Application PCT/IL2007/000576 Patentability Report dated Mar. 19, 2009.

International Application PCT/IL2007/000576 Search Report dated Jul. 7, 2008.

International Application PCT/IL2007/000579 Patentability report dated Mar. 10, 2009.

International Application PCT/IL2007/000579 Search report dated Jul. 3, 2008.

International Application PCT/IL2007/000580 Patentability Report dated Mar. 10, 2009.

International Application PCT/IL2007/000580 Search Report dated Sep. 11, 2008.

International Application PCT/IL2007/000581 Patentability Report dated Mar. 26, 2009.

International Application PCT/IL2007/000581 Search Report dated Aug. 25, 2008.

International Application PCT/IL2007/001059 Patentability report dated Apr. 19, 2009.

International Application PCT/IL2007/001059 Search report dated Aug. 7, 2008.

International Application PCT/IL2007/001315 search report dated Aug. 7, 2008.

International Application PCT/IL2007/001315 Patentability Report dated May 5, 2009.

International Application PCT/IL2007/001316 Search report dated Jul. 22, 2008.

International Application PCT/IL2007/001316 Patentability Report dated May 5, 2009.

International Application PCT/IL2007/001488 Search report dated Jun. 20, 2008.

International Application PCT/IL2008/000329 Search report dated Nov. 25, 2008.

International Application PCT/IL2008/000519 Search report dated Nov. 20, 2008.

International Application PCT/IL2008/001188 Search Report dated Jan. 28, 2009.

International Application PCT/IL2008/001356 Search Report dated Feb. 3, 2009.

International Application PCT/IL2008/001446 Search report dated Feb. 20, 2009.

International Application PCT/IL2008/001446 "Optimized selection of memory chips in multi-chip memory devices" filed Nov. 4, 2008.

Perlmutter et al, U.S. Appl. No. 12/332,368 "Efficient Interference Cancellation in Analog Memory Cell Arrays" filed Dec. 11, 2008.

Kasorla et al, U.S. Appl. No. 12/332,370 "Efficient Data Storage in Multi-Plane Memory Devices" filed Dec. 11, 2008.

Sommer, N., U.S. Appl. No. 12/364,531 "Parameter Estimation Based on Error Correction Code Parity Check Equations" filed Feb. 3, 2009.

Golov et al., U.S. Appl. No. 12/344,233 "Wear Level Estimation in Analog Memory Cells" filed Dec. 25, 2008.

Perlmutter et al., U.S. Appl. No. 12/388,528 "Programming of Analog Memory Cells Using a Single Programming Pulse per State Transition" filed Feb. 19, 2009.

Perlmutter et al., U.S. Appl. No. 12/390,522 "Programming Analog Memory Cells for Reduced Variance After Retention" filed Feb. 23, 2009.

Perlmutter et al., U.S. Appl. No. 12/405,275 "Memory Device with Multiple-Accuracy Read Commands" filed Mar. 17, 2009.

Perlmutter et al., U.S. Appl. No. 12/397,368 "Efficient Readout from Analog Memory Cells Using Data Compression" filed Mar. 4, 2009.

Sommer, N., U.S. Appl. No. 12/171,797 "Memory Device with Non-Uniform Programming Levels" filed Jul. 11, 2008.

Shalvi et al., U.S. Appl. No. 12/251,471 "Compensation for Voltage Drifts in Analog Memory Cells" filed Oct. 15, 2008.

U.S. Appl. No. 12/019,011 Official Action dated Nov. 20, 2009.

Takeuchi et al., "A Multipage Cell Architecture for High-Speed Programming Multilevel NAND Flash Memories", IEEE Journal of Solid State Circuits, vol. 33, No. 8, Aug. 1998.

Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.

US 7,161,836, 01/2007, Wan et al. (withdrawn)

* cited by examiner

RELIABLE DATA STORAGE IN ANALOG MEMORY CELLS IN THE PRESENCE OF TEMPERATURE VARIATIONS

CROSS-REFERENCE TO RELATED APPLICATIONS

This application claims the benefit of U.S. Provisional Patent Application 60/978,146, filed Oct. 8, 2007, whose disclosure is incorporated herein by reference.

FIELD OF THE INVENTION

The present invention relates generally to memory devices, and particularly to methods and systems for data storage in arrays of analog memory cells.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. The storage value represents the information stored in the cell. In Flash memories, for example, each analog memory cell holds a certain amount of electrical charge. The range of possible analog values is typically divided into regions, each region corresponding to one or more data bit values. Data is written to an analog memory cell by writing a nominal analog value that corresponds to the desired bit or bits.

Some memory devices, which are commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the $24^{th}$ International Conference on Microelectronics (MIEL), Nis, Serbia and Montenegro, May 16-19, 2004, volume 1, pages 377-384, which is incorporated herein by reference.

The analog storage values (e.g., threshold voltages, also referred to herein as cell voltages) stored in analog memory cells are often affected by the device temperature. Various techniques for temperature compensation in analog memory devices are known in the art. For example, U.S. Patent Application Publication 2007/0159892, whose disclosure is incorporated herein by reference, describes a programming method for Flash memory, which is capable of compensating for the reduction of read margins between states due to high temperature stress. Other temperature compensation techniques are described, for example, in U.S. Pat. Nos. 6,560,152, 7,057,958, 7,277,355 and 7,342,831, and in U.S. Patent Application Publications 2003/0189856, 2007/0159892 and 2008/0025121, whose disclosures are incorporated herein by reference.

SUMMARY OF THE INVENTION

An embodiment of the present invention provides a method for data storage, including:

at a first time, programming a first group of analog memory cells at a known first temperature, so as to cause the analog memory cells in the first group to assume respective first analog storage values;

at a second time at which the analog memory cells are at a second temperature, reading respective second analog storage values from the analog memory cells in the first group;

estimating a shift between the first analog storage values and the second analog storage values;

adjusting a memory access parameter responsively to the estimated shift; and accessing a second group of the analog memory cells at the second temperature using the adjusted memory access parameter.

In some embodiments, estimating the shift includes reading the first analog storage values at the first time using a read threshold, reading the second analog storage values at the second time using the read threshold, and calculating the shift responsively to a difference between a first number of the first analog storage values that fall on a given side of the read threshold and a second number of the second analog storage values that fall on the given side of the read threshold. In an embodiment, estimating the shift includes evaluating a statistical property of the shift.

In a disclosed embodiment, accessing the second group of the analog memory cells includes programming the analog memory cells in the second group at the second time, and adjusting the memory access parameter includes anticipating, at the second time, a temperature difference between the second temperature and a third temperature at which the second group of the analog memory cells will be read, and setting the memory access parameter responsively to the anticipated temperature difference. In another embodiment, accessing the second group of the analog memory cells includes programming the analog memory cells in the second group to assume target storage values and verifying the target storage values using one or more verification thresholds, and adjusting the memory access parameter includes adjusting at least one of the verification thresholds.

Additionally or alternatively, accessing the second group of the analog memory cells includes programming the analog memory cells in the second group by applying to the cells a sequence of programming pulses that increment by a step size, and adjusting the memory access parameter includes adjusting the step size. Further additionally or alternatively, accessing the second group of the analog memory cells includes programming the analog memory cells in the second group by applying to the cells a sequence of programming pulses that progressively increment in amplitude beginning from an initial amplitude, and adjusting the memory access parameter includes adjusting the initial amplitude.

In yet another embodiment, accessing the second group of the analog memory cells includes programming the analog memory cells in the second group to assume a set of programming levels, and adjusting the memory access parameter includes modifying a number of the programming levels in the set. Additionally or alternatively, accessing the second group of the analog memory cells includes storing in the analog memory cells in the second group data that is encoded with an Error Correcting Code (ECC), and adjusting the memory access parameter includes modifying a redundancy level of the ECC. In still another embodiment, accessing the second group of the analog memory cells includes reading the analog memory cells in the second group using one or more read thresholds, and adjusting the memory access parameter includes adjusting at least one of the read thresholds.

In some embodiment, accessing the second group of the analog memory cells includes programming the cells in the second group and storing an indication of the second temperature at which the cells are programmed. In a disclosed embodiment, the method includes reading the analog memory cells in the second group at a third time at which the analog memory cells are at a third temperature by:

retrieving the stored indication of the second temperature;
adjusting a reading parameter responsively to a difference between the second and third temperatures; and
reading the analog memory cells in the second group using the adjusted reading parameter.

There is additionally provided, in accordance with an embodiment of the present invention, a data storage apparatus, including:

an interface, which is operative to communicate with a memory that includes a plurality of analog memory cells; and
a processor, which is coupled to program a first group of the analog memory cells at a first time at a known first temperature, so as to cause the analog memory cells in the first group to assume respective first analog storage values, to read respective second analog storage values from the analog memory cells in the first group at a second time at which the analog memory cells are at a second temperature, to estimate a shift between the first analog storage values and the second analog storage values, to adjust a memory access parameter responsively to the estimated shift, and to access a second group of the analog memory cells at the second temperature using the adjusted memory access parameter.

There is also provided, in accordance with an embodiment of the present invention, a data storage apparatus, including:

a memory, which includes a plurality of analog memory cells; and
a processor, which is coupled to program a first group of the analog memory cells at a first time at a known first temperature, so as to cause the analog memory cells in the first group to assume respective first analog storage values, to read respective second analog storage values from the analog memory cells in the first group at a second time at which the analog memory cells are at a second temperature, to estimate a shift between the first analog storage values and the second analog storage values, to adjust a memory access parameter responsively to the estimated shift, and to access a second group of the analog memory cells at the second temperature using the adjusted memory access parameter.

The present invention will be more fully understood from the following detailed description of the embodiments thereof, taken together with the drawings in which:

DETAILED DESCRIPTION OF EMBODIMENTS

Overview

Figure 1:
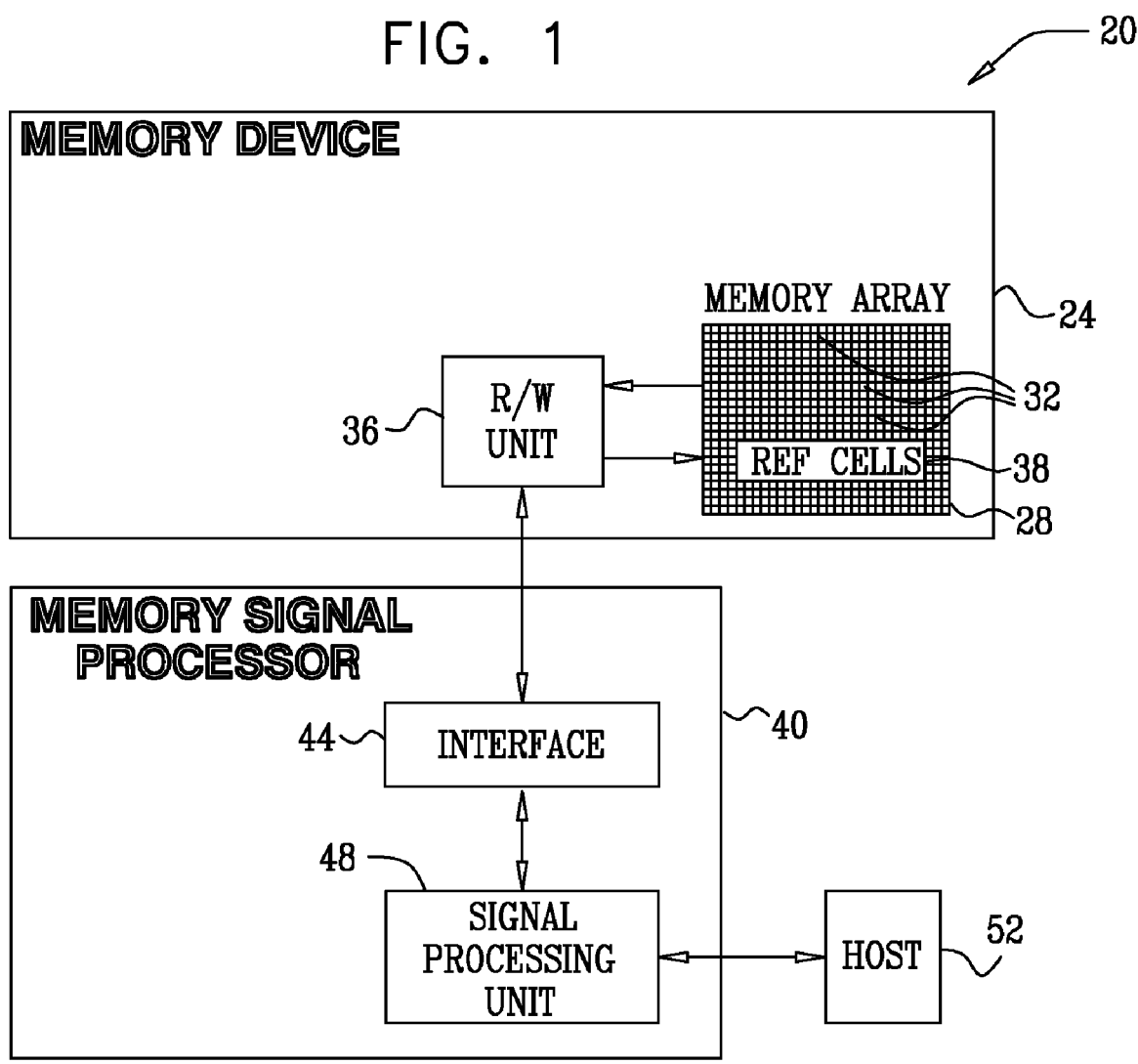
FIG. 1 is a block diagram that schematically illustrates a memory system, in accordance with an embodiment of the present invention.

The analog storage values (e.g., threshold voltages) stored in analog memory cells are often shifted as a function of the temperature of the memory device. These temperature-related shifts may degrade the performance of the memory device severely. Embodiments of the present invention that are described herein provide improved methods and systems for estimating the temperature of the memory device, and for compensating for temperature-related voltage shifts.

In some embodiments, a Memory Signal Processor (MSP) stores data in a memory device having a plurality of analog memory cells. The MSP assigns a group of the analog memory cells to serve as reference cells, and programs these cells with known data when the device is at a known baseline temperature. The MSP sets a certain read threshold, reads the reference cells and records the number of reference cells whose storage values exceed the threshold as a baseline cell count. At a later time, the temperature of the memory device may change. The MSP estimates the shift in threshold voltages (and therefore the current temperature of the memory device) by re-reading the reference cells using the same read threshold and re-counting the number of cells whose values exceed the threshold. The difference between the two cell counts is indicative of the voltage shift, and therefore of the difference between the current device temperature and the baseline temperature.

In some embodiments, the MSP adjusts one or more memory access parameters based on the estimated shift. The memory access parameters may comprise any parameter that is related to storing data in the memory cells or to retrieving data in the memory cells, such as various parameters of the P&V process, read thresholds that are used for reading the cells, the level of redundancy of an Error Correction Code (ECC) that is used to encode the stored data, and the number of bits stored in each cell.

For example, if the current device temperature is near the edge of the specified range of the device, the difference between the temperature at the time of programming and the temperature at the time of reading may be large. In such a case, the MSP programs the cells with high accuracy and/or reliability in order to account for the possible distortion caused by this temperature difference. If, on the other hand, the current device temperature is near the middle of the specified temperature range, the difference between the temperature at the time of programming and the temperature at the time of reading is likely to be smaller. In such cases, the accuracy and/or reliability requirements can be relaxed.

In some embodiments, the MSP maintains a data structure that holds the temperatures at which different cell groups (e.g., memory blocks) were programmed. Using this mechanism, when intending to read data from a given cell group, the MSP can determine both the temperature at which the cells were programmed and the current temperature at which the cells are to be read. In some embodiments, the MSP adjusts one or more reading parameters based on the difference between the programming-time and reading-time temperatures. For example, the MSP may adjust the read thresholds used for reading the cells as a function of the temperature difference.

The methods and systems described herein are highly efficient in measuring the memory device temperature and in compensating for temperature-related voltage shifts. Unlike some known methods that employ dedicated temperature sensing and compensation circuitry, the methods and systems described herein do not require such dedicated circuitry. As such, these techniques can be used with various sorts of memory devices with a need for additional hardware. Since the temperature estimation methods described herein are based on the actual intrinsic behavior of the memory cells and not on sensing circuitry that is external to the cells, they are highly accurate in compensating for temperature variations occurring in the memory cells.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

System 20 comprises a memory device 24, which stores data in a memory cell array 28. The memory cell array comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and CTF Flash cells, PCM, NROM, FRAM, MRAM and DRAM cells. Memory cells 32 may comprise Single-Level Cells (SLC) or Multi-Level Cells (MLC, also referred to as multi-bit cells).

The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values to the cell.

Memory device 24 comprises a reading/writing (R/W) unit 36, which converts data for storage in the memory device to storage values and writes them into memory cells 32. In alternative embodiments, the R/W unit does not perform the conversion, but is provided with voltage samples, i.e., with the storage values for storage in the cells. The R/W unit typically (although not necessarily) programs the cells using an iterative Program and Verify (P&V) process, as is known in the art. When reading data out of array 28, R/W unit 36 converts the storage values of memory cells 32 into digital samples having a resolution of one or more bits. Data is typically written to and read from the memory cells in groups that are referred to as pages.

Array 28 comprises a group of reference cells 38, which are used for estimating the temperature of memory device 24 and for compensating for temperature variations. Reference cells 38 typically comprise a subset of cells 32, which are assigned to serve as reference cells. The assignment of cells 38 may be fixed or variable. In other words, different groups of cells 32 may be assigned to serve as reference cells at different times. Several temperature estimation and compensation methods are described in detail hereinbelow.

The storage and retrieval of data in and out of memory device 24 is performed by a Memory Signal Processor (MSP) 40. MSP 40 comprises an interface 44 for communicating with memory device 24, and a signal processing unit 48, which processes the data that is written into and read from device 24. In some embodiments, unit 48 produces the storage values for storing in the memory cells and provides these values to R/W unit 36. Alternatively, unit 48 provides the data for storage, and the conversion to storage values is carried out by the R/W unit internally to the memory device.

MSP 40 communicates with a host 52, for accepting data for storage in the memory device and for outputting data retrieved from the memory device. MSP 40, and in particular unit 48, may be implemented in hardware. Alternatively, MSP 40 may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and MSP 40 are implemented as two separate Integrated Circuits (ICs). In alternative embodiments, however, the memory device and MSP may be integrated on separate semiconductor dies in a single Multi-Chip Package (MCP) or System on Chip (SoC). Further alternatively, some or all of the MSP circuitry may reside on the same die on which the memory array is disposed. Further alternatively, some or all of the functionality of MSP 40 can be implemented in software and carried out by a processor or other element of the host system, or by a suitable memory controller. In some implementations, a single MSP 40 may be connected to multiple memory devices 24. In yet another embodiment, some or all of the MSP functionality may be carried out by a separate unit, referred to as a memory extension, which acts as a slave of memory device 24.

Typically, the MSP (or any other controller or processor that carries out some or all of the methods described herein) comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

Memory cells 32 of array 28 are typically arranged in a grid having multiple rows and columns, commonly referred to as word lines and bit lines, respectively. The array is typically divided into multiple pages, i.e., groups of memory cells that are programmed and read simultaneously. Cells are typically erased in groups of word lines that are referred to as erasure blocks.

In some embodiments, R/W unit 36 programs memory cells 32 using an iterative Program and Verify (P&V) process. In a typical P&V process, an entire memory page is written by applying a sequence of programming pulses to a group of memory cells that are mapped to this page. The level of the programming pulses increases incrementally from pulse to pulse. The storage values programmed in the cells are read ("verified") after each pulse, and the iterations continue until the desired levels are reached.

Temperature Estimation Using Threshold Voltage Shift Measurement

The analog storage values stored in cells 32 are often affected by the temperature of the memory device. When the temperature of a given analog memory cell changes, its threshold voltage typically exhibits a shift. In other words, there usually exists a monotonic relationship between device temperature and threshold voltage shift.

Figure 2:
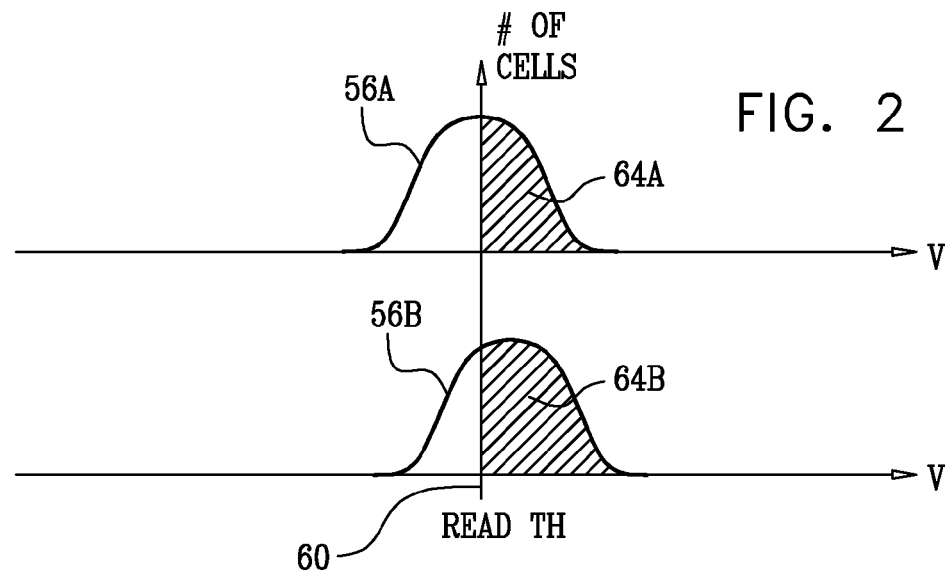
FIG. 2 is a graph showing threshold voltage distributions in a group of analog memory cells, in accordance with an embodiment of the present invention.

FIG. 2 is a graph showing threshold voltage distributions in a group of analog memory cells, in accordance with an embodiment of the present invention. A plot 56A shows the threshold voltage distribution in a given group of cells 32 (e.g., a page or a block) at a certain temperature. A plot 56B shows the threshold voltage distribution in the same group of cells at a different temperature. Distributions 56A and 56B may have been measured at different points in time. For example, one distribution may correspond to a "cold start" situation in which electrical power was applied to the memory device recently, while the other distribution may correspond to steady-state operating conditions. Alternatively, temperature variations may occur for any other reason.

As can be seen in the figure, distributions 56A and 56B are shifted with respect to one another due to the temperature difference. In particular, when the cells are read by comparing their storage values to a read threshold 60, the number of cells whose storage value exceeds the threshold will differ between the two distributions. In the present example, the number of cells whose values exceed threshold 60 in distribution 56A is represented by the area of a region 64A. In distribution 56B, the number of cells whose values exceed threshold 60 is represented by the area of a region 64B. Since distribution 56B is right-shifted with respect to distribution 56A, region 64B is larger than region 64A. In other words, the number of cells whose values exceed threshold 60 is larger in distribution 56B than in distribution 56A.

As demonstrated by the above example, the number of cells whose value exceeds a given read threshold is indicative of the voltage shift that occurred in the cells, and therefore of the temperature of the memory device. The methods and systems described herein use this mechanism for estimating the temperature of device 24 and for compensating for temperature variations when programming or reading the cells.

Figure 3:
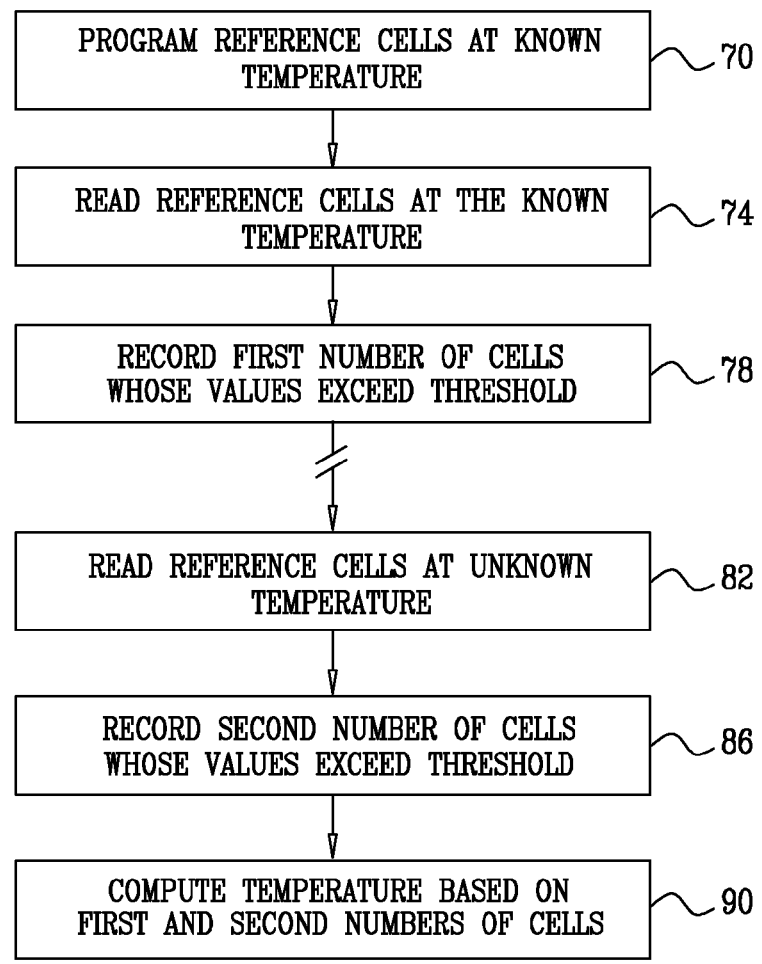
FIG. 3 is a flow chart that schematically illustrates a method for estimating memory device temperature, in accordance with an embodiment of the present invention.

FIG. 3 is a flow chart that schematically illustrates a method for estimating memory device temperature, in accordance with an embodiment of the present invention. The method begins with MSP 40 programming reference cells 38 with known data (i.e., to known programming levels) at a known temperature, at a baseline programming step 70. If cells 38 comprise multi-level cells, they may be programmed with any desired number of bits, i.e., to any desired subset of the possible programming levels.

After programming reference cells 38, the MSP (using R/W unit 36) reads the reference cells while the memory device is still at the known temperature, at a baseline reading step 74. The cells are read using a predetermined read threshold, which is typically positioned approximately in the middle of the distribution. The MSP records the number of cells whose values exceed the read threshold, at a baseline counting step 78. This number is referred to below as the baseline number of cells. The baseline number is indicative of the known temperature at which steps 70-74 were carried out. This known temperature is referred to herein as the baseline temperature. The MSP may store the baseline number (and possibly also the baseline temperature) in one or more of cells 32, or in any other suitable location.

The baseline measurement procedure of steps 70-78 may be carried out during production or final testing of the memory device, such as by a tester having a controlled known temperature (e.g., room temperature) in the production line.

At a later point in time, the temperature of memory device 24 may vary. At steps 82-90 below, the MSP estimates the current temperature of the memory device (or, equivalently, the shift in temperature with respect to the baseline temperature). The MSP reads reference cells 38 at an unknown temperature, at a reading step 82. The read threshold used for reading the reference cells at step 82 is substantially the same as the one used at baseline reading step 74 above. After reading the reference cells at the unknown temperature, the MSP records the number of cells whose values exceed the read threshold, at a counting step 86.

The MSP compares the baseline number of cells recorded at step 78 with the number of cells recorded at step 86, at a temperature estimation step 90. The difference between the two numbers is indicative of the difference between the unknown present temperature and the known baseline temperature. The relationship between the difference in cells count and the difference in temperature is assumed to be known to the MSP. Such a relationship can be pre-calculated and provided to the MSP, such as by conducting off-line measurements at various temperatures on one or more memory devices. Typically, the MSP calculates a statistical property of the voltage shift (e.g., the average voltage shift between the baseline temperature and the unknown temperature) and estimates the unknown temperature based on this statistical property.

In the description above, the MSP counts the number of cells whose values are above the threshold. Equivalently, however, the MSP may count the number of cells whose values are below the read threshold. Although the description above refers to a single read threshold, the MSP may alternatively read the reference cells using multiple read thresholds. In particular, when using multi-level cells having multiple voltage distributions, the MSP may use read thresholds that are positioned in two or more of the distributions. Reading the reference cells using a set of multiple read thresholds provides the MSP with additional information regarding the distribution shift, and may improve the shift and temperature estimation accuracy.

The MSP may carry out steps 82-90 at different times and/or in response to different events. For example, the MSP may estimate the temperature at periodic time intervals or when it is idle from other tasks. Additionally or alternatively, the MSP may estimate the temperature in response to receiving a request to read data from a group of cells 32 or to store data in a group of cells 32, so as to determine the current temperature at the time the storage operation is performed.

Optimizing Memory Access Parameters Based on Device Temperature

When intending to store data in memory cells 32, the MSP may modify one or more parameters related to programming and/or reading the memory cells as a function of the estimated temperature-related voltage shift that occurred in the cells, in order to improve performance when possible. Memory access parameters that are related to programming the cells are referred to herein as programming parameters. Memory access parameters that are related to reading the cells are referred to herein as reading parameters.

In some embodiments, the MSP modifies the programming parameters of a certain cell group depending on the maximum anticipated difference in temperature between the time the cells are programmed and the time the cells are read. When the temperature difference between programming and reading is expected to be large, the MSP programs the cells with higher accuracy and/or reliability in order to better compensate for the distortion caused by the temperature difference. When the temperature difference between programming and reading is expected to be small, the MSP may relax the programming parameters in order to improve programming speed, capacity or other system performance.

Assume, for example, that memory device 24 is specified to operate within the temperature range of 0-50° C. If the device temperature when programming a group of cells is at the edge of this range, then the maximum possible temperature difference between programming and reading the cells may reach the full 50° C. difference. In such a case, the MSP typically programs the cells more accurately in order to better account for the possible distortion.

If, on the other hand, the device temperature when programming the group of cells is in the middle of the range, then the maximum possible temperature difference between programming and reading the cells is on the order of only 25° C. In this scenario, programming parameters can be somewhat relaxed, since the maximum possible temperature difference is relatively small.

The MSP may modify any suitable parameter related to programming of the memory cells based on the estimated device temperature. For example, the MSP may modify the verify thresholds, i.e., the thresholds that are used in the P&V process to verify that the cells have reached their intended programming levels. In some embodiments, the MSP sets the value of the lowest verify threshold (the verify threshold of the lowest programming level) to the lowest possible voltage, which still maintains a sufficiently low probability that the expected temperature shift will cause the cell voltage to drift below a minimum permitted voltage. The minimum permitted voltage may comprise the minimal voltage that can be sensed and read by the device (e.g., 0V). When the expected temperature shift is small, the lowest verify threshold can be set to a low value, thus increasing the overall available voltage window of the cells. When the expected temperature difference is large, the lowest verify threshold is increased in order to ensure that the cell voltage does not drift below the minimum permitted voltage.

As another example, the MSP can modify the highest verify threshold to the highest possible voltage, which maintains a sufficiently low probability that the expected temperature shift will cause the cell voltage to exceed the maximum permitted voltage. The maximum permitted voltage may be defined as the highest voltage that can be sensed and read by the device, the maximum voltage that prevents over-programming effects (e.g., Back Pattern Dependency—BPD), or any other suitable definition.

Additionally or alternatively, the MSP may modify the verify thresholds of the different programming levels, so as to maintain a certain separation between adjacent programming levels. This feature is especially important when the cell voltage shift depends on the actual cell voltage and not only on the temperature.

In some embodiments, the MSP may modify the incremental step size of the P&V process, i.e., the amplitude difference between successive programming pulses. When the expected temperature difference between programming and reading is large (e.g., when the temperature at programming time is at the edge of the specified range), the MSP may set a small step size in order to program the cells accurately. When the expected temperature difference is small (e.g., when the temperature at programming time is in the middle of the specified range), the MSP may set a larger step size in order to increase programming speed and reduce cell wearing. As yet another example, the MSP may modify the initial amplitude of the sequence of programming pulses, i.e., the amplitude of the first pulse in the sequence. This technique may be advantageous, for example, when the responsiveness of the cells to programming pulses depends on temperature.

In some embodiments, the MSP encodes the stored data using an Error Correction Code (ECC). In these embodiments, the MSP may modify the code rate of the ECC or otherwise modify the amount of redundancy introduced by the ECC, depending on the estimated temperature at programming time. As yet another example, the MSP may modify the number of bits stored in each cell (i.e., the number of programming levels) depending on the estimated temperature. By modifying the number of bits per cell and/or the ECC redundancy, the MSP can set different trade-offs between capacity and resilience to voltage shifts.

The MSP may adapt any set of one or more programming parameters, as desired. The MSP may modify and optimize the programming parameters for the entire memory device or separately per die, per erasure block or even per word line or memory page.

Figure 4:
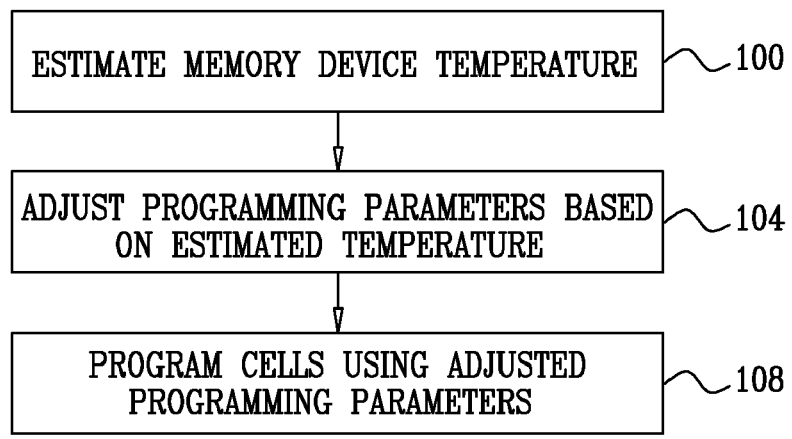
FIG. 4 is a flow chart that schematically illustrates a method for programming a group of analog memory cells, in accordance with an embodiment of the present invention.

FIG. 4 is a flow chart that schematically illustrates a method for programming a group of analog memory cells, in accordance with an embodiment of the present invention. The method begins with MSP 40 estimating the current temperature of device 24, at an estimation step 100. For example, the MSP may apply the method of FIG. 3 above for this purpose. The MSP adjusts one or more programming parameters based on the estimated device temperature (i.e., based on the estimated voltage shift in the cells), at a parameter modification step 104. The MSP then stores data in a group of the memory cells by programming the cells using the adjusted programming parameters, at a programming step 108.

The MSP may estimate the device temperature and/or adjust the programming parameters at different times and/or in response to different triggers. For example, the MSP may estimate the temperature and/or adjust the programming parameters at periodic time intervals or when it is idle. Additionally or alternatively, the MSP may estimate the temperature and/or adjust the programming parameters in response to receiving a request to store data in a group of the memory cells.

Storing Programming-Time Temperatures of Different Cell Groups

In some embodiments, the MSP maintains a database or other data structure, which holds the estimated temperature at which each memory block was written. The data structure can be stored in some of memory cells 32 or in any other suitable location. When intending to read data from a certain block, the MSP can determine the temperature at which the data was originally written by retrieving the relevant information from the data structure. Additionally, the MSP can determine the current temperature at which the data is to be read using the methods described above, and optimize the performance of the reading operation based on the two temperatures. For example, the MSP can estimate the shift in cell voltage between programming time and reading time as a function of the two temperatures. Based the estimated voltage shift, the MSP can modify the read thresholds used for reading the cells or otherwise modify the reading operation.

This technique is especially important in configurations in which the programming parameters remain fixed regardless of temperature. In these configurations, programming parameters are not adapted to account for temperature variations, but the reading operation can be modified to provide at least partial compensation. In other configurations, the programming parameters provide only partial compensation for temperature variations. In these configurations, the reading operation can be modified to provide additional compensation.

Figure 5:
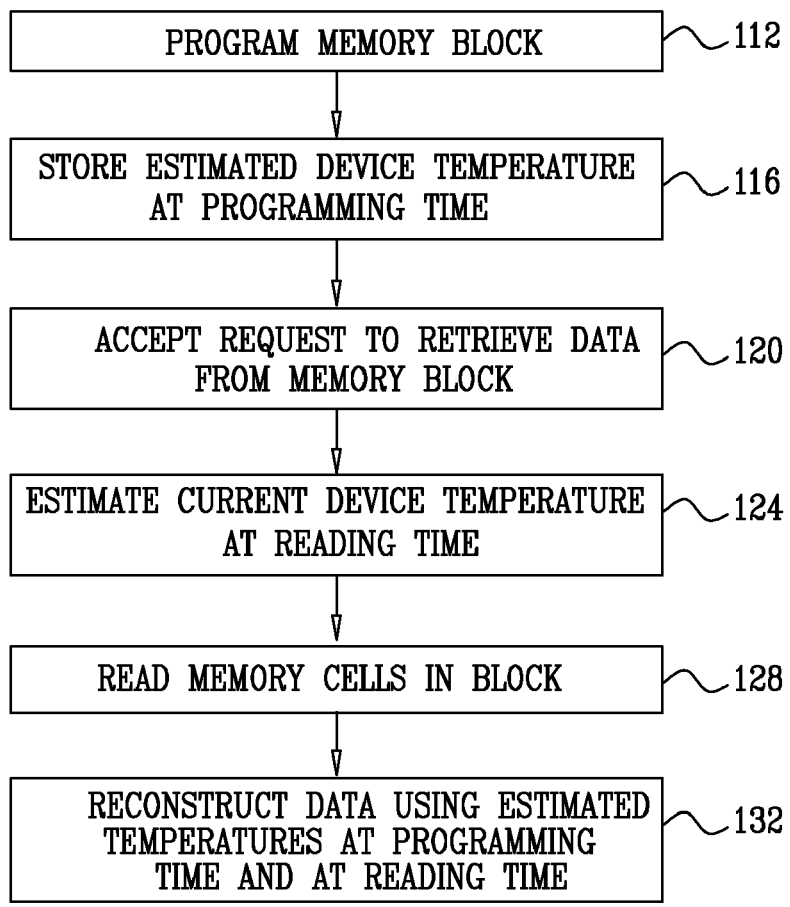
FIG. 5 is a flow chart that schematically illustrates a method for programming and reading a group of analog memory cells, in accordance with an embodiment of the present invention.

FIG. 5 is a flow chart that schematically illustrates a method for programming and reading a group of analog memory cells, in accordance with an embodiment of the present invention. The method begins with MSP 40 storing data in a block of memory cells 32 in array 28, at a storage step 112. The MSP estimates the memory device temperature at the time of programming (e.g., using the method of FIG. 3 above) and stores the estimated temperature, at a temperature storage step 116.

At a later point in time, the MSP accepts a request to retrieve data from the memory block in question, at a request acceptance step 120. In response to the request, the MSP estimates the current temperature of the memory device, at a reading temperature estimation step 124. The MSP reads the requested memory cells, at a reading step 128, and reconstructs the data from the read results, at a reconstruction step 132. The MSP modifies the parameters of the reading and/or data reconstruction operations based on the difference between the temperature at the time the data was programmed and the temperature at the time the data was read. For example, the MSP may estimate the cell voltage shift that occurred between programming and reading the data based on the temperature difference, and adjust the read thresholds used for reading the cells based on the estimated voltage shift.

The programming and reading parameters described herein are chosen by way of example. In alternative embodiments, the MSP may adjust any other suitable memory access parameter. Although the embodiments described herein mainly address data storage and retrieval in solid-state memory devices, the principles of the present invention can also be used for storing and retrieving data in Hard Disk Drives (HDD) and other data storage media and devices.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for data storage, comprising:
   at a first time, programming a first group of analog memory cells at a known first temperature, so as to cause the analog memory cells in the first group to assume respective first analog storage values;
   at a second time at which the analog memory cells are at a second temperature, reading respective second analog storage values from the analog memory cells in the first group;
   estimating a shift between the first analog storage values and the second analog storage values;
   adjusting a memory access parameter responsively to the estimated shift; and
   accessing a second group of the analog memory cells at the second temperature using the adjusted memory access parameter.

2. The method according to claim 1, wherein estimating the shift comprises reading the first analog storage values at the first time using a read threshold, reading the second analog storage values at the second time using the read threshold, and calculating the shift responsively to a difference between a first number of the first analog storage values that fall on a given side of the read threshold and a second number of the second analog storage values that fall on the given side of the read threshold.

3. The method according to claim 1, wherein estimating the shift comprises evaluating a statistical property of the shift.

4. The method according to claim 1, wherein accessing the second group of the analog memory cells comprises programming the analog memory cells in the second group at the second time, and wherein adjusting the memory access parameter comprises anticipating, at the second time, a temperature difference between the second temperature and a third temperature at which the second group of the analog memory cells will be read, and setting the memory access parameter responsively to the anticipated temperature difference.

5. The method according to claim 1, wherein accessing the second group of the analog memory cells comprises programming the analog memory cells in the second group to assume target storage values and verifying the target storage values using one or more verification thresholds, and wherein adjusting the memory access parameter comprises adjusting at least one of the verification thresholds.

6. The method according to claim 1, wherein accessing the second group of the analog memory cells comprises programming the analog memory cells in the second group by applying to the cells a sequence of programming pulses that increment by a step size, and wherein adjusting the memory access parameter comprises adjusting the step size.

7. The method according to claim 1, wherein accessing the second group of the analog memory cells comprises programming the analog memory cells in the second group by applying to the cells a sequence of programming pulses that progressively increment in amplitude beginning from an initial amplitude, and wherein adjusting the memory access parameter comprises adjusting the initial amplitude.

8. The method according to claim 1, wherein accessing the second group of the analog memory cells comprises programming the analog memory cells in the second group to assume a set of programming levels, and wherein adjusting the memory access parameter comprises modifying a number of the programming levels in the set.

9. The method according to claim 1, wherein accessing the second group of the analog memory cells comprises storing in the analog memory cells in the second group data that is encoded with an Error Correcting Code (ECC), and wherein adjusting the memory access parameter comprises modifying a redundancy level of the ECC.

10. The method according to claim 1, wherein accessing the second group of the analog memory cells comprises reading the analog memory cells in the second group using one or more read thresholds, and wherein adjusting the memory access parameter comprises adjusting at least one of the read thresholds.

11. The method according to claim 1, wherein accessing the second group of the analog memory cells comprises programming the cells in the second group and storing an indication of the second temperature at which the cells are programmed.

12. The method according to claim 11, and comprising reading the analog memory cells in the second group at a third time at which the analog memory cells are at a third temperature by:
retrieving the stored indication of the second temperature;
adjusting a reading parameter responsively to a difference between the second and third temperatures; and
reading the analog memory cells in the second group using the adjusted reading parameter.

13. A data storage apparatus, comprising:
an interface, which is operative to communicate with a memory that includes a plurality of analog memory cells; and
a processor, which is coupled to program a first group of the analog memory cells at a first time at a known first temperature, so as to cause the analog memory cells in the first group to assume respective first analog storage values, to read respective second analog storage values from the analog memory cells in the first group at a second time at which the analog memory cells are at a second temperature, to estimate a shift between the first analog storage values and the second analog storage values, to adjust a memory access parameter responsively to the estimated shift, and to access a second group of the analog memory cells at the second temperature using the adjusted memory access parameter.

14. The apparatus according to claim 13, wherein the processor is coupled to read the first analog storage values at the first time using a read threshold, to read the second analog storage values at the second time using the read threshold, and to calculate the shift responsively to a difference between a first number of the first analog storage values that fall on a given side of the read threshold and a second number of the second analog storage values that fall on the given side of the read threshold.

15. The apparatus according to claim 13, wherein the processor is coupled to evaluate a statistical property of the shift.

16. The apparatus according to claim 13, wherein the processor is coupled, at the second time, to program the analog memory cells in the second group, to anticipate a temperature difference between the second temperature and a third temperature at which the second group of the analog memory cells will be read, and to set the memory access parameter responsively to the anticipated temperature difference.

17. The apparatus according to claim 13, wherein the processor is coupled to program the analog memory cells in the second group at the second time to assume target storage values and to verify the target storage values using one or more verification thresholds, and wherein the memory access parameter comprises at least one of the verification thresholds.

18. The apparatus according to claim 13, wherein the processor is coupled to program the analog memory cells in the second group at the second time by applying to the cells a sequence of programming pulses that increment by a step size, and wherein the memory access parameter comprises the step size.

19. The apparatus according to claim 13, wherein the processor is coupled to program the analog memory cells in the second group at the second time by applying to the cells a sequence of programming pulses that progressively increment in amplitude beginning from an initial amplitude, and wherein the memory access parameter comprises the initial amplitude.

20. The apparatus according to claim 13, wherein the processor is coupled to program the analog memory cells in the second group at the second time to assume a set of programming levels, and wherein the memory access parameter comprises a number of the programming levels in the set.

21. The apparatus according to claim 13, wherein the processor is coupled to store in the analog memory cells in the second group data that is encoded with an Error Correcting Code (ECC), and wherein the memory access parameter comprises a redundancy level of the ECC.

22. The apparatus according to claim 13, wherein the processor is coupled to read the analog memory cells in the second group at the second time using one or more read thresholds, and wherein the memory access parameter comprises at least one of the read thresholds.

23. The apparatus according to claim 13, wherein the processor is coupled to program the cells in the second group at the second time and to store an indication of the second temperature at which the cells are programmed.

24. The apparatus according to claim 23, wherein the processor is coupled to read the analog memory cells in the second group at a third time at which the analog memory cells are at a third temperature by:
retrieving the stored indication of the second temperature;
adjusting a reading parameter responsively to a difference between the second and third temperatures; and
reading the analog memory cells in the second group using the adjusted reading parameter.

25. A data storage apparatus, comprising:
a memory, which comprises a plurality of analog memory cells; and
a processor, which is coupled to program a first group of the analog memory cells at a first time at a known first temperature, so as to cause the analog memory cells in the first group to assume respective first analog storage values, to read respective second analog storage values from the analog memory cells in the first group at a second time at which the analog memory cells are at a second temperature, to estimate a shift between the first analog storage values and the second analog storage values, to adjust a memory access parameter responsively to the estimated shift, and to access a second group of the analog memory cells at the second temperature using the adjusted memory access parameter.

* * * * *